US006812755B2

United States Patent
Yee et al.

(10) Patent No.: US 6,812,755 B2
(45) Date of Patent: Nov. 2, 2004

(54) VARIATION REDUCTION TECHNIQUE FOR CHARGE PUMP TRANSISTOR AGING

(75) Inventors: Gin S. Yee, Sunnyvale, CA (US); Claude R. Gauthier, Cupertino, CA (US); Pradeep R. Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/349,779

(22) Filed: Jan. 23, 2003

(65) Prior Publication Data

US 2004/0145396 A1 Jul. 29, 2004

(51) Int. Cl.$^7$ .................................................. H03L 7/06
(52) U.S. Cl. ...................................... 327/157; 327/148
(58) Field of Search ................................. 327/148, 149, 327/152, 156, 157, 158

(56) References Cited

U.S. PATENT DOCUMENTS

| 5,986,487 A | * 11/1999 | Ridgers ...................... 327/157 |
| 6,476,663 B1 | 11/2002 | Gauthier et al. ............ 327/513 |
| 6,664,831 B2 | * 12/2003 | Gauthier et al. ............ 327/159 |

\* cited by examiner

*Primary Examiner*—Timothy P. Callahan
*Assistant Examiner*—Cassandra Cox
(74) *Attorney, Agent, or Firm*—Osha & May L.L.P.

(57) ABSTRACT

A charge pump is arranged to generate a current dependent on a phase difference between a first signal and a second signal. A reference circuit is operatively connected to the charge pump and arranged to adjust the charge pump so that the charge pump is independent of an aging effect.

20 Claims, 8 Drawing Sheets

VARIATION REDUCTION TECHNIQUE FOR CHARGE PUMP TRANSISTOR AGING

BACKGROUND OF INVENTION

As shown in FIG. 1, a typical computer system (10) has, among other components, a microprocessor (12), one or more forms of memory (14), integrated circuits (16, 17) having specific functionalities, and peripheral computer resources (not shown), e.g., monitor, keyboard, software programs, etc. These components communicate with one another via communication paths (19), e.g., wires, buses, etc., to accomplish the various tasks of the computer system (10).

In order to properly accomplish such tasks, the computer system (10) relies on the basis of time to coordinate its various operations. To that end, a crystal oscillator (18) generates a system clock signal (referred to and known in the art as "reference clock" and shown in FIG. 1 as SYS_CLK) to various parts of the computer system (10). Modern microprocessors and other integrated circuits, however, are typically capable of operating at frequencies significantly higher than the system clock signal, and thus, it becomes important to ensure that operations involving the microprocessor (12) and the other components of the computer system (10) use a proper and accurate reference of time.

One component used within the computer system (10) to ensure a proper reference of time among the system clock signal and a microprocessor clock signal, i.e., "chip clock signal" or CHIP_CLK, is a type of clock generator known as a phase locked loop (PLL) (20). The PLL (20) is an electronic circuit that controls an oscillator such that the oscillator maintains a constant phase relative to the system clock signal. Referring to FIG. 1, the PLL (20) has as its input the system clock signal, which is its reference signal, and outputs a chip clock signal (shown in FIG. 1 as CHIP_CLK) to the microprocessor (12). The system clock signal and chip clock signal have a specific phase and frequency relationship controlled by the PLL (20). This relationship between the phases and frequencies of the system clock signal and chip clock signal ensures that the various components within the microprocessor (12) use a controlled and accounted for reference of time. When this relationship is not maintained by the PLL (20), however, the operations within the computer system (10) become non-deterministic.

Another component used within the computer system (10) to ensure a proper reference of time among the system clock signal and a microprocessor clock signal, i.e., "clock out signal" or CLK_OUT, is a type of clock generator known as a delay locked loop (DLL) (22). As the frequencies of modern computers continue to increase, the need to rapidly transmit data between chip interfaces also increases. To accurately receive data, a clock signal is often sent to help recover the data. The clock signal determines when the data should be sampled or latched by a receiver circuit.

The clock signal may transition at the beginning of the time the data is valid. The receiver circuit, however, may require that the clock signal transition during the middle of the time the data is valid. Also, the transmission of the clock signal may degrade as it travels from its transmission point. In both circumstances, a delay locked loop (22), or "DLL," may be used to regenerate a copy of the clock signal at a fixed phase shift with respect to the original clock signal.

In FIG. 1, data is transmitted from integrated circuit (17) to the microprocessor (12). To aid in the recovery of the transmitted data, a clock signal (21) is also transmitted with the data. The microprocessor (12) may also transmit data to the integrated circuit (17) using an additional clock signal (not shown). The clock signal (21) may transition from one state to another at the beginning of data transmission. The microprocessor (12) requires a clock signal temporally located some time after the beginning of the valid data. Furthermore, the clock signal (21) may have degraded during transmission. The DLL (22) has the ability to regenerate the clock signal (21) to a valid state and to create a phase shifted version of the clock signal (21) to be used by other circuits. For example, the microprocessor (12) may use the phase shifted version of the clock signal (21) as the receiver circuit's sampling signal. The receiver circuit's sampling signal determines when the input to the receiver circuit should be sampled. The performance of a DLL (22) is critical and must maintain a proper reference of time on the CPU, or generically, an integrated circuit.

Circuit elements in a microprocessor (12), and more generally, an IC (16, 17), continue to get smaller. Accordingly, more and more circuit elements may be packed into an IC (16, 17). In FIG. 2, a cross sectional diagram of a particular type of circuit element, a p-channel transistor (200), is shown. The p-channel transistor (200) includes two n+ regions (204, 206) implanted in a p-substrate (210) or a p-well. The two n+ regions (204, 206) form a drain and source region for the p-channel transistor (200). The depth of the drain and source regions may determine a junction (209) thickness for current to flow from one n+ region (204 or 206), through a channel formed below a gate (202) when the transistor (200) is "on," to the other n+ region (206 or 204). A source contact (212) and drain contact (214) allow a connection with the n+ regions (204, 206), respectively. The p-channel transistor (200) is separated from other devices by a field oxide (230, 232).

The p-channel transistor (200) is controlled by a voltage potential on a gate (202). A gate contact (216) allows a connection with the gate (202). The gate (202) is separated from the p-substrate (210) by a gate oxide (208).

A voltage potential difference between the source contact (212) and drain contact (214) is denoted $V_{ds}$. A voltage potential difference between the gate contact (216) and the source contact (212) is denoted $V_{gs}$. The voltage potential to turn the p-channel transistor (200) "on," i.e., allow the p-channel transistor (200) to conduct current, is a threshold voltage potential denoted $V_t$.

FIG. 3 shows a diagram of a current-voltage characteristic for a typical metal-oxide transistor. As shown in FIG. 3, the p-channel transistor (200 shown in FIG. 2) is "off" when $|V_{gs}| < |V_t|$ (255). The p-channel transistor (200 shown in FIG. 2) is "on" and in a linear region of operation when $|V_{ds}| \leq |V_{gs}| - V_t|$ and $|V_{gs}| \geq |V_t|$ (265). The p-channel transistor (200 shown in FIG. 2) is "on" and in a saturation region of operation when $|V_{ds}| > |V_{gs-Vt}|$ and $|V_{gs}| \geq |V_t|$ (275).

As circuit elements in an IC (16, 17 shown in FIG. 1) continue to get smaller, features of the circuit elements, e.g., the gate oxide thickness, the depth of the two n+ regions (204, 206 shown in FIG. 2), the spacing between the two n+regions (204, 206 shown in FIG. 2), etc., get smaller.

SUMMARY OF INVENTION

According to one aspect of the present invention, an integrated circuit comprises a charge pump arranged to generate a current dependent on a phase difference between a first signal and a second signal; and a reference circuit operatively connected to the charge pump and arranged to adjust the charge pump so that the charge pump operates substantially independent of an aging effect.

According to one aspect of the present invention, a method comprises detecting a phase difference between a first signal and a second signal; generating a current dependent on the detecting; and adjusting the current dependent on a reference circuit that is responsive to an aging effect.

According to one aspect of the present invention, an apparatus comprises means for detecting a phase difference between a first signal and a second signal; means for generating a current dependent on the means for detecting; means for generating an aging independent reference signal where the means for generating the aging independent reference signal is responsive to an aging effect of the apparatus; and means for adjusting the current dependent on the means for generating the aging independent reference signal.

Other aspects and advantages of the invention will be apparent from the following description and the appended claims.

DETAILED DESCRIPTION

Figure 1:
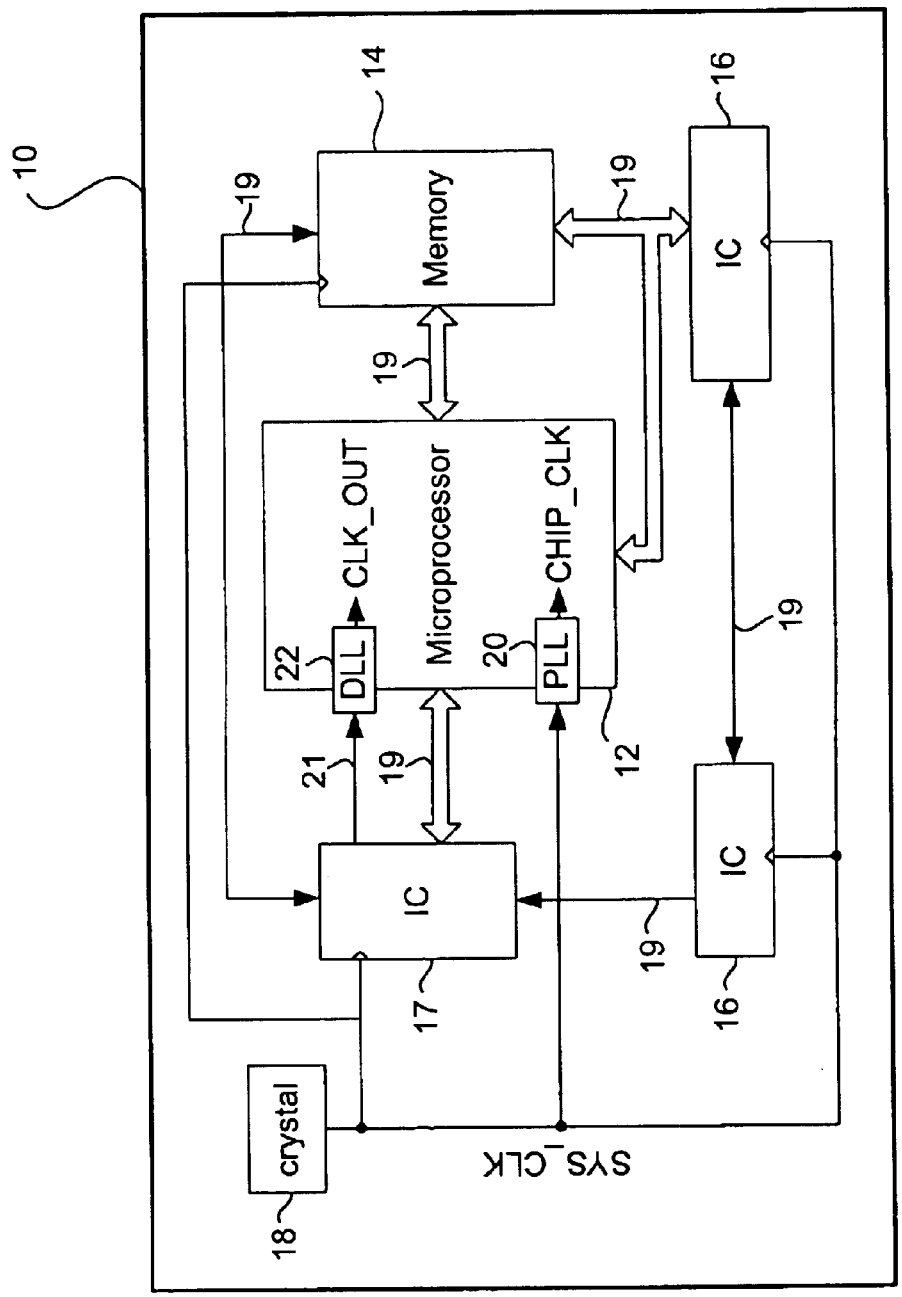
FIG. 1 shows a diagram of a typical computer system.

Embodiments of the present invention relate to a method and apparatus for a charge pump adjustment system in an integrated circuit. Adjustments are made to the charge pump dependent on an "aging effect" of transistors. Like elements in various figures are denoted by like reference numerals throughout the figures for consistency.

Figure 2:
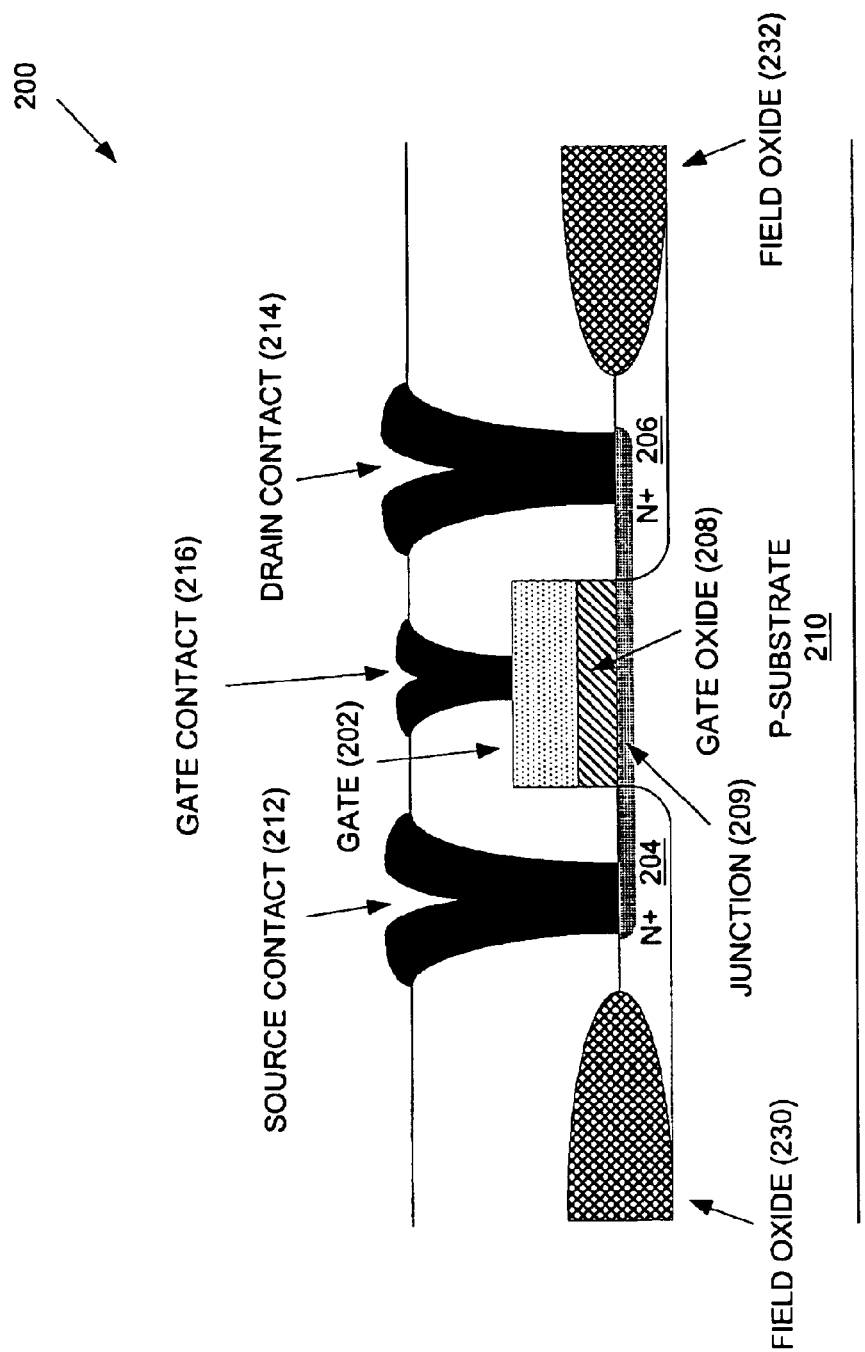
FIG. 2 shows a cross sectional diagram of a typical p-channel transistor.
Figure 3:
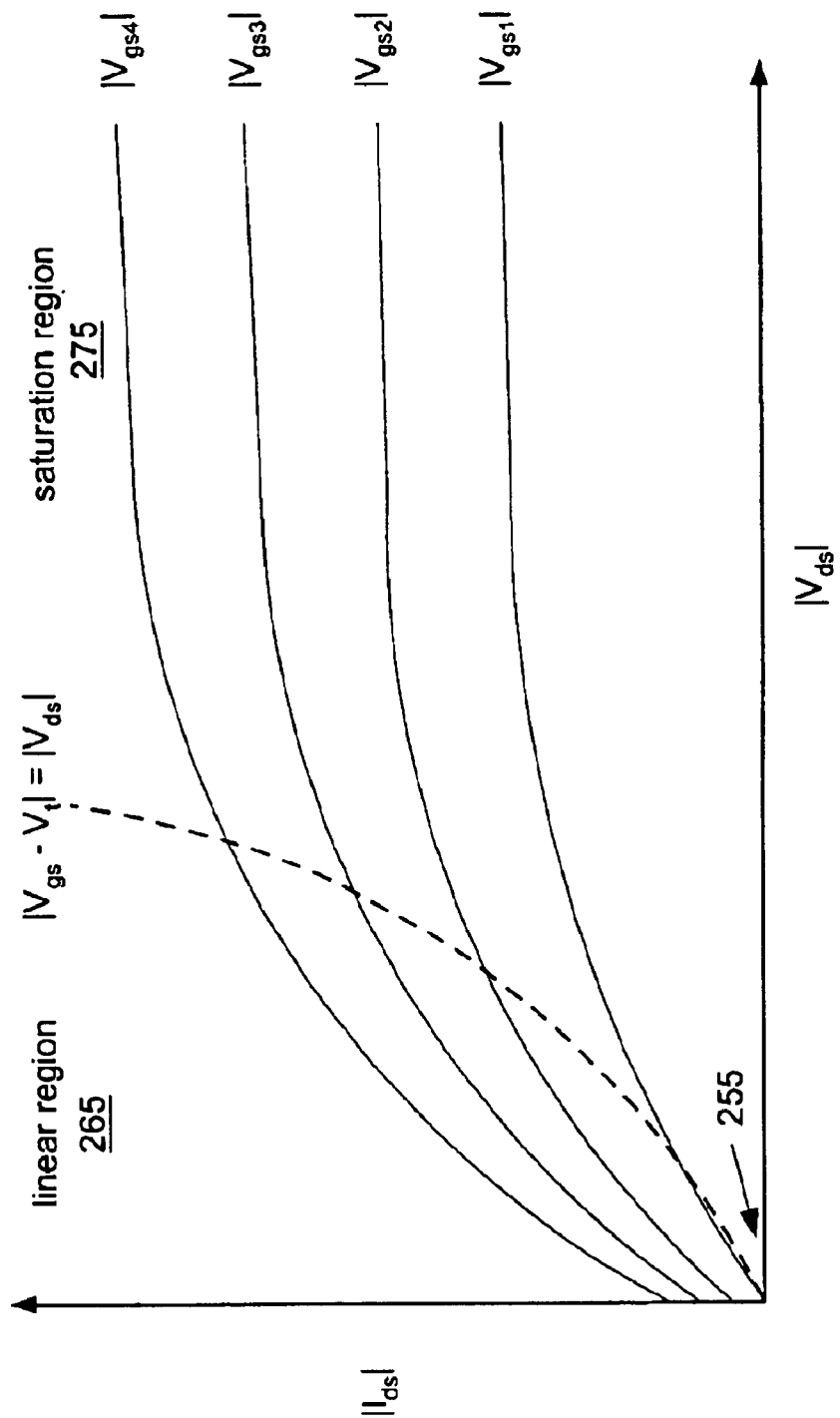
FIG. 3 shows a diagram of a current-voltage characteristic for a typical metal-oxide transistor.

As circuit elements (i.e., n-channel and/or p-channel transistors) in an IC (e.g., 16 and 17 shown in FIG. 1) continue to get smaller, one effect is that the gate oxide thickness (208 shown in FIG. 2) becomes thinner. The thin gate oxide thickness may cause a threshold voltage potential to vary, or "age," over time. As a transistor ages with time, the threshold voltage potential of the transistor may increase. Accordingly, aging of a transistor may affect critical circuits, thereby adversely impacting IC performance.

Also, as circuit elements (i.e., transistors) get smaller, a channel formed for conduction of current between the n+ regions (204, 206 shown in FIG. 2) may have a junction (209) thickness that is thinner relative to prior generation transistors. Furthermore, a depth of the two n+ regions (204, 206 shown in FIG. 2) implanted in a p-substrate (210 shown in FIG. 2) or a p-well may cause a junction (209) thickness that is thinner relative to prior generation transistors. Similarly, n-channel transistors may have a thin junction thickness. A thin junction (209) thickness formed by the channel and shallower implant regions (to form a source and drain region of a transistor) may cause a transistor to "age" over time. Aging may affect one or more operational characteristics of a transistor as time elapses from when the transistor was manufactured. Accordingly, aging of a transistor may affect critical circuits, thereby adversely impacting IC performance.

Figure 4:
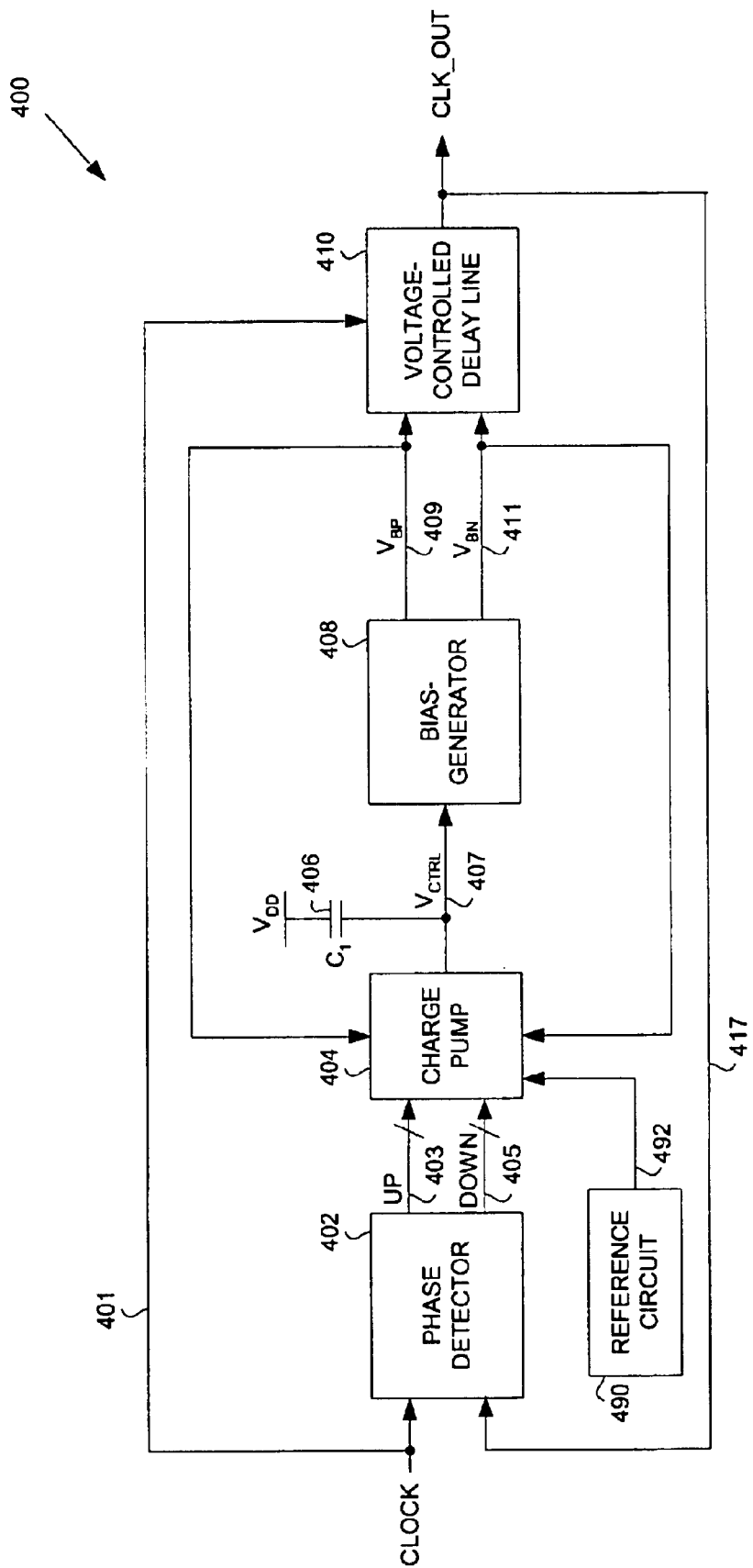
FIG. 4 shows a block diagram of a delay locked loop system in accordance with an embodiment of the present invention.

FIG. 4 shows a block diagram of an exemplary delay locked loop (DLL) system (400) in accordance with an embodiment of the present invention. Clock signal (401) is input to the DLL system (400) to create a phased (i.e., delayed) output. Particularly, clock signal (401) is input to a voltage-controlled delay line (410) and to a phase detector (402) of the DLL system (400). The phase detector (402) measures whether a phase difference between the clock signal (401) and an output signal, clk_out (417), of the voltage-controlled delay line (410) has the desired amount of delay. Depending on the phase difference, the phase detector (402) produces signals that control a charge pump (404). The phase detector (402) uses an up signal (403) and a down signal (405) to adjust the charge pump (404) to increase or decrease its output current.

To ensure that the charge pump (404) maintains some nominal current output, the charge pump (404) is internally biased. The internal biasing of the charge pump (404) is dependent on bias signals, $V_{BP}$ (409) and $V_{BN}$ (411), generated from a bias generator (408) (discussed below). The up and down signals (403, 405) adjust the current output of the charge pump (404) with respect to the nominal current set by the bias signals (409, 411).

The charge pump (404) adds or removes charge from a capacitor $C_1$ (406), which, in turn, changes a voltage potential at the input of the bias-generator (408). The capacitor (406) is connected between a power supply, $V_{DD}$, and a control signal, $V_{CTRL}$ (407). The bias-generator (408) produces the bias signals (409, 411) in response to the control signal (407), which, in turn, controls the delay of the voltage-controlled delay line (410) and, as mentioned above, maintains a nominal current output from the charge pump (404).

In FIG. 4, the voltage-controlled delay line (410) may be implemented using current starved elements. In other words, the delays of the voltage-controlled delay line (410) may be controlled by modifying the amount of current available for charging and discharging capacitances within the voltage-controlled delay line (410). The linearity of a voltage controlled delay line's characteristics determines the stable range of frequencies over which the DLL system (400) can operate. The output signal (417) of the voltage-controlled delay line (410) represents a phase delayed copy of clock signal (401) that is then used by other circuits.

Still referring to FIG. 4, the negative feedback created by the output signal (417) in the DLL system (400) adjusts the delay through the voltage-controlled delay line (410). The phase detector (402) integrates the phase error that results between the clock signal (401) and the output signal (417). The voltage-controlled delay line (410) delays the output signal (417) by a fixed amount of time such that a desired delay between the clock signal (401) and the output signal (417) is maintained.

Proper operation of the microprocessor (12 shown in FIG. 1) depends on the DLL system (400) maintaining a constant phase delay between the clock signal (401) and the output signal (417). The DLL system (400) may not operate as desired if circuit elements vary, or "age," over time. In one embodiment of the present invention, a reference circuit (490) is operatively connected using a reference signal line (492) to the charge pump (404). One of ordinary skill in the art will understand that the reference signal line (492) may carry a digital or analog signal.

In FIG. 4, the reference circuit (490) generates a signal to the charge pump (404) that is representative of variations caused by aging. In one embodiment of the present invention, the charge pump (404) is operatively adjusted such that variations due to aging of circuit elements within the charge pump (404) are reduced. One of ordinary skill in the art understands that most circuits age; however, circuit elements within the charge pump (404) may age such that the charge pump (404) varies dramatically from the charge pump's (404) initial design parameters. The reference circuit (490) generates a signal, representative of variations caused by aging, that helps reduce variations in the charge pump (404) caused by aging effects.

Figure 5:
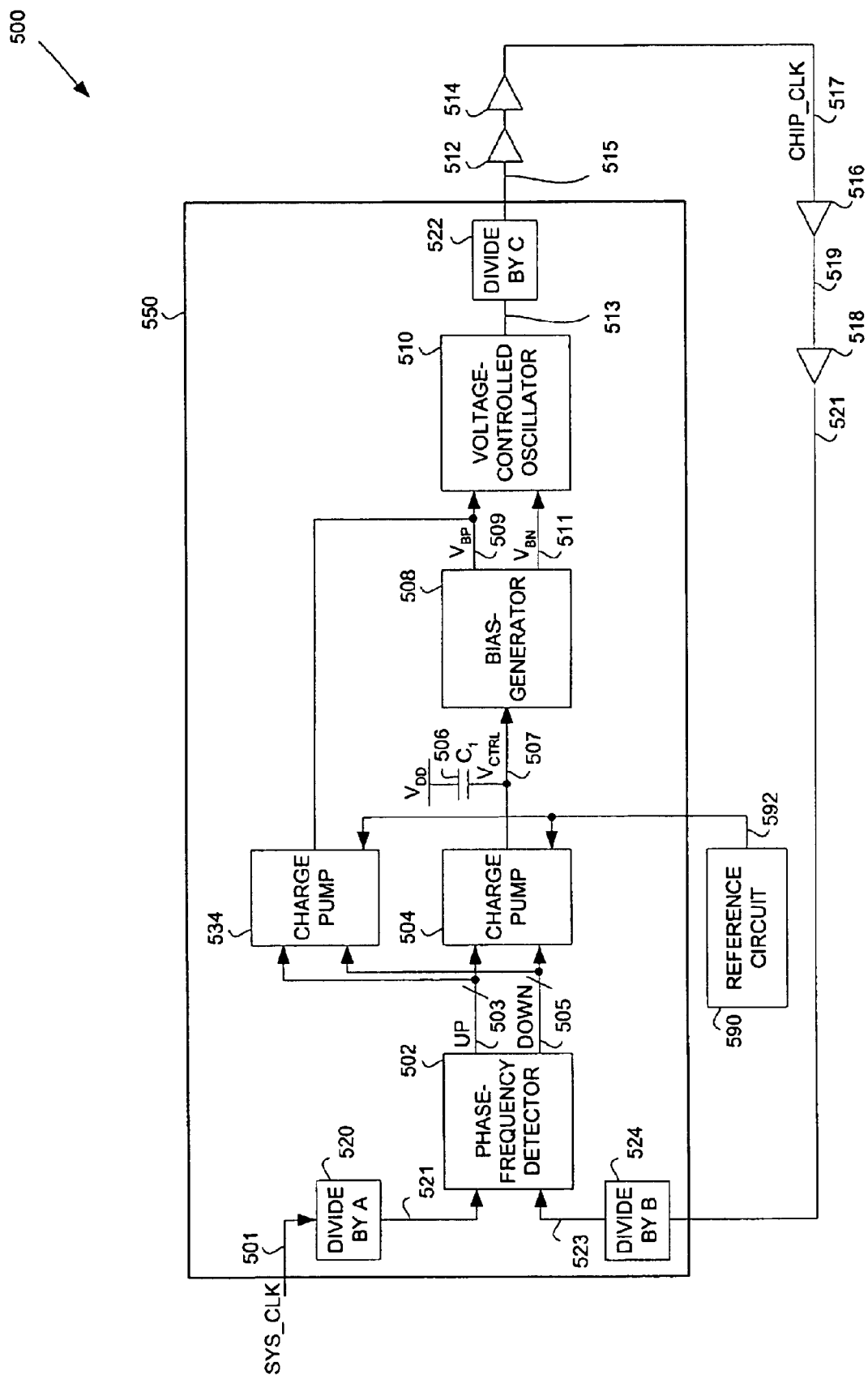
FIG. 5 shows a block diagram of a phase locked loop system in accordance with an embodiment of the present invention.

FIG. 5 shows a block diagram of an exemplary phase locked loop (PLL) system (500) in accordance with an embodiment of the present invention. The PLL system (500) includes a PLL core (550), buffers (512, 514, 516, 518), and a feedback loop signal (521) on a feedback loop path. The buffers (512, 514) increase the drive strength of an output clock signal (515) to supply other circuits of the microprocessor (12 in FIG. 1) with a chip clock signal (517). The buffers (516, 518) buffer the chip clock signal (517) to additional circuits of the microprocessor (12 in FIG. 1). The time delay created by the buffers (512, 514, 516, 518) is accounted for in the feedback signal (521) that is supplied to the PLL core (550).

The PLL core (550) is designed to output the chip clock signal (517), which is a multiple of the system clock signal (501). When the PLL system (500) is in "lock," the chip clock signal (517) and system clock signal (501) maintain a specific phase and frequency relationship. To allow different multiplication ratios, the PLL core (550) may use several "divide by" circuits. A "divide by" circuit reduces the frequency of the input to the "divide by" circuit at its output by a specified factor. For example, the PLL core (550) uses a divide by A circuit (520) with the system clock signal (501), a divide by C circuit (522) with a voltage-controlled oscillator (510) output signal (513), and a divide by B circuit (524) with the feedback loop signal (521).

A phase-frequency detector (502) aligns the transition edge and frequency of a clock A signal (521) and a clock B signal (523). The phase-frequency detector (502) adjusts its output frequency in order to zero any phase and frequency difference between the clock A signal (521) and the clock B signal (523). The phase-frequency detector (502) produces signals that control charge pumps (504, 534). The phase-frequency detector (502) controls the charge pumps (504, 534) to increase or decrease their output using control signals up (503) and down (505). The charge pump (504) adds or removes charge from a capacitor $C_1$ (506) that changes the voltage potential at the input of a bias-generator (508). The capacitor (506) is connected between a power supply $V_{DD}$ and a voltage potential on a control signal $V_{CTRL}$ (507). The charge pump (534) adds or removes charge from a bias voltage $V_{BP}$ (509) of a bias-generator (508).

The bias-generator (508) produces bias voltages $V_{BP}$ (509) and $V_{BN}$ (511) in response to the voltage potential on the control signal (507). The PLL core (550) may be self-biased by adding the charge pump (534) to the bias-generator (508) bias voltage $V_{BP}$ (509). The addition of a second charge pump (534) allows the removal of a resistor in series with the capacitor (506). A voltage-controlled oscillator (510) produces an output signal (513) that has a frequency related to the bias voltages $V_{BP}$ (509) and $V_{BN}$ (511).

The "divide by" circuits (520, 522, 524) determine the frequency multiplication factor provided by the PLL core (550). The addition of "divide by" circuits (520, 522, 524) enables the PLL core (550) to multiply the system clock signal (501). Multiplying the system clock signal (501) is useful when the chip clock signal (517) must have a higher frequency than the system clock signal (501).

For example, the variables A and C may both be set to one in the divide by A circuit (520) and divide by C circuit (522), respectively. The variable B may be set to 10 in the divide by B circuit (524). The phase-frequency detector (502) aligns the transition edge and frequency of the clock A signal (521) and the clock B signal (523). The phase-frequency detector (502) adjusts the PLL core (550) output clock signal (515) frequency in order to zero any phase and frequency difference between the clock A signal (521) and the clock B signal (523). Because the clock B signal (523) has a divide by B circuit (524) that reduces its input frequency by 10, the phase-frequency detector (502) adjusts the voltage-controlled oscillator (510) output signal (513) to a frequency 10 times greater than the clock A signal (521). Accordingly, the chip clock signal (517) is 10 times higher in frequency than the system clock signal (501).

Proper operation of the microprocessor (12 shown in FIG. 1) depends on the PLL system (500) maintaining a constant phase delay between the system clock signal (501) and the chip clock signal (517). The PLL system (500) may not operate as desired if circuit elements vary, or "age," over time. In one embodiment of the present invention, a reference circuit (590) is operatively connected using a reference signal line (592) to the charge pumps (504, 534). One of ordinary skill in the art will understand that the reference signal line (592) may carry a digital or analog signal.

In FIG. 5, the reference circuit (590) generates a signal to the charge pumps (504, 534) that is representative of variations caused by aging. In an embodiment of the present invention, the charge pumps (504, 534) are operatively adjusted such that variations due to aging of circuit elements within the charge pumps (504, 534) are reduced.

Figure 6:
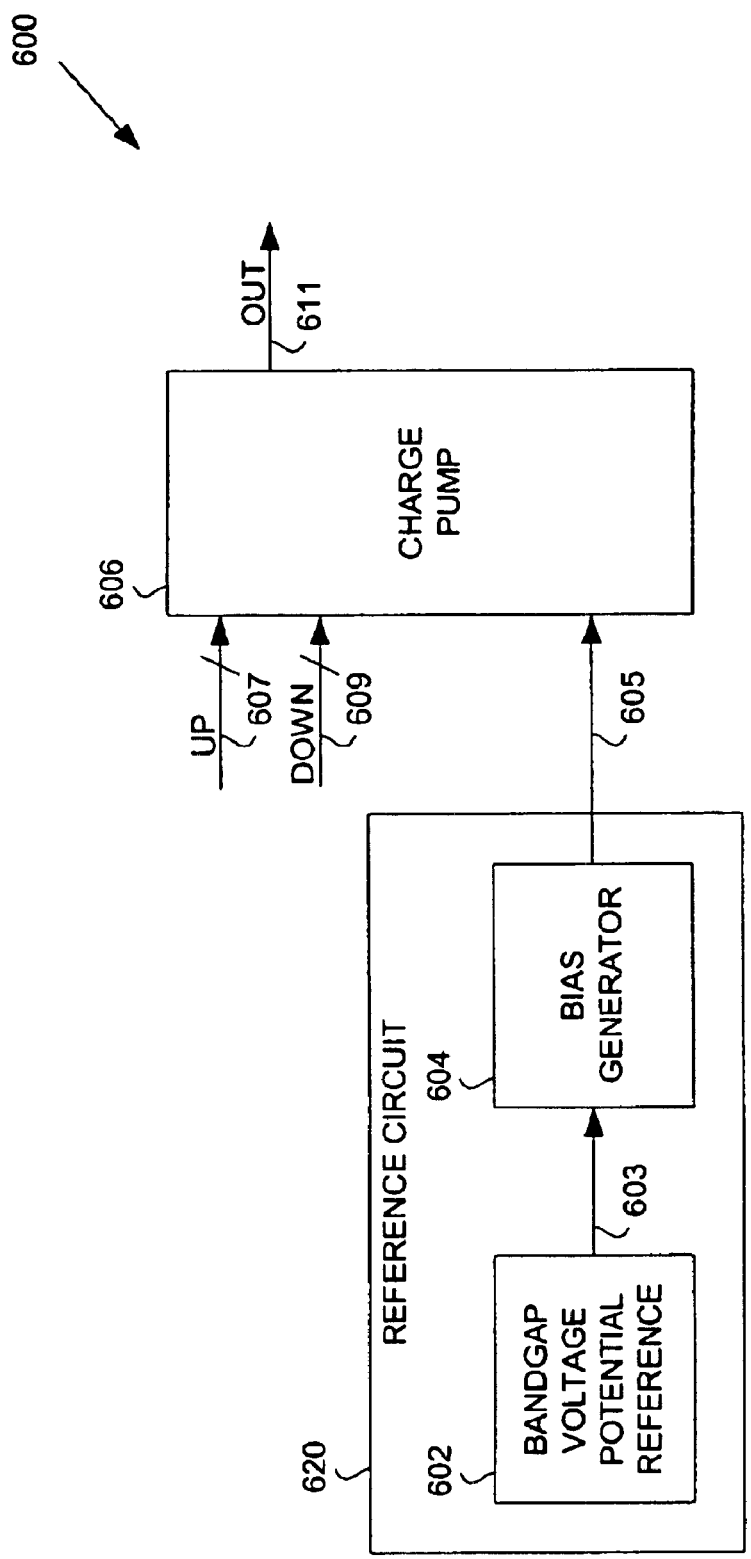
FIG. 6 shows a block diagram of a charge pump adjustment system in accordance with an embodiment of the present invention.

FIG. 6 shows a block diagram of an exemplary charge pump adjustment system (600) in accordance with an embodiment of the present invention. The charge pump adjustment system (600) includes a charge pump (606) and a reference circuit (620). The charge pump (606) generates a current on an out signal (611) dependent on an up signal (607) and a down signal (609). In one embodiment of the present invention, the current on the out signal (611) increases or decreases dependent on which of the up signal (607) or the down signal (609) is at a high state for a longer duration. The current on the out signal (611) of the charge pump (606) may vary over time, caused by aging of circuit elements in the charge pump (606). A reference circuit (620) is operatively connected using a reference signal line (605) to the charge pump (606). One of ordinary skill in the art will understand that the reference signal line (605) may carry a digital or analog signal. In one embodiment of the present invention, the reference signal line (605) carries an analog signal representative of variations caused by aging.

The reference circuit (620) includes an aging independent reference circuit (602) and a bias circuit (604). In an embodiment of the present invention, the aging independent reference circuit (602) may generate a voltage potential or a current for an aging independent reference signal on signal line (603). Accordingly, signal line (603) may carry the aging independent reference signal that is substantially independent with respect to aging effects. In one embodiment of the present invention, the aging independent reference circuit (602) may be a bandgap voltage potential reference.

The bias circuit (604) may use the aging independent reference signal on signal line (603) to determine a variation in transistor performance caused by aging effects. A signal on the reference signal line (605) may represent a result of a comparison between the aging independent reference signal on signal line (603) and at least one transistor whose performance may have varied due to aging effects. For example, a threshold voltage potential may vary, or "age," over time. The signal on the reference signal line (605) may adjust the charge pump (606) such that the current on the out signal (611) responds to the up signal (607) or the down signal (609) regardless of aging that may occur within circuit elements in the charge pump (606).

One or ordinary skill in the art will understand that the charge pump (606) may also be biased by other circuits besides the reference circuit (620). For example, the charge pump (606) may be biased by bias signals, $V_{BP}$ (409 shown in FIG. 4) and $V_{BN}$ (411 shown in FIG. 4), generated from a bias generator (408 shown in FIG. 4) (discussed above).

Figure 7:
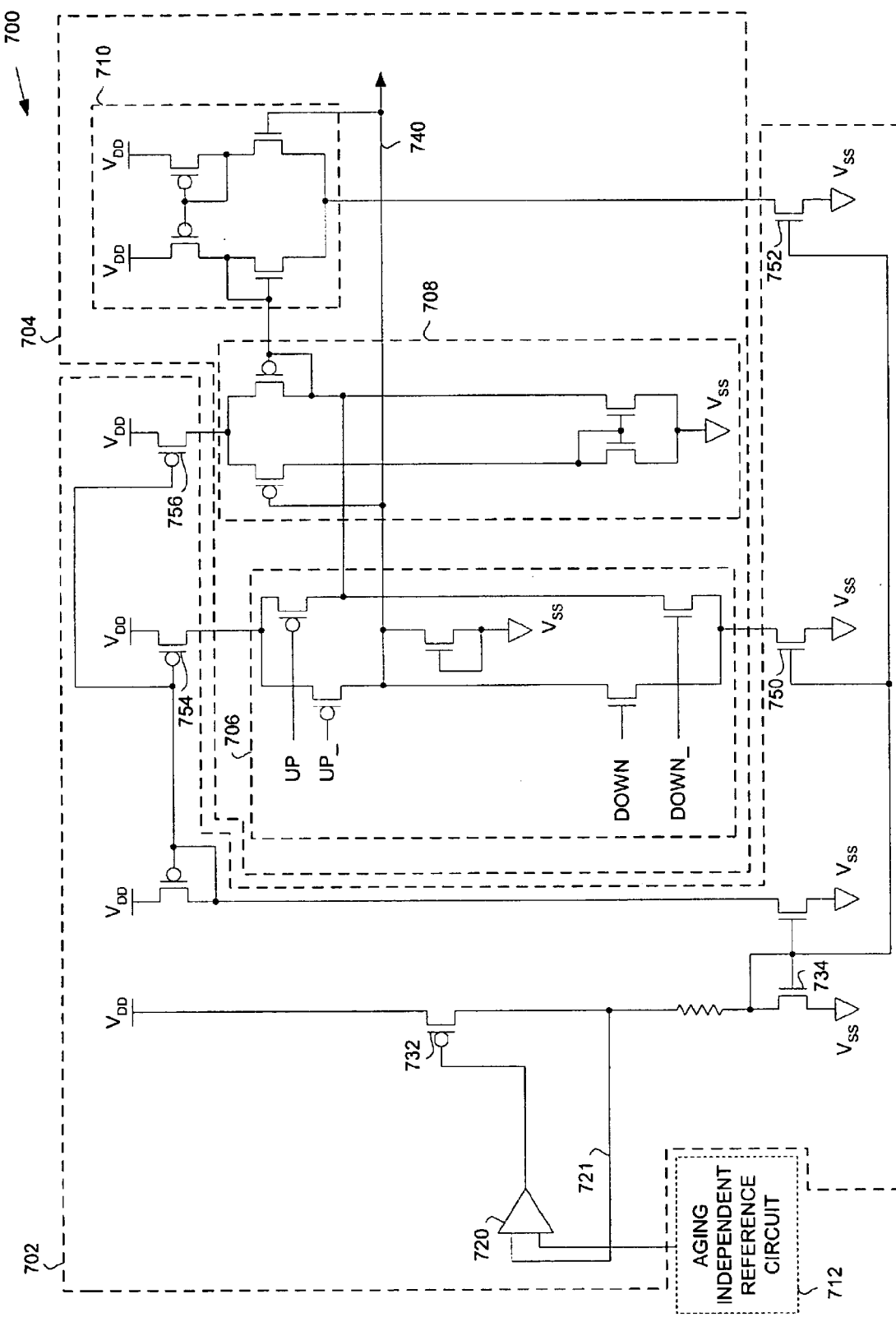
FIG. 7 shows a schematic diagram of a charge pump adjustment system in accordance with an embodiment of the present invention.

FIG. 7 shows a schematic diagram of an exemplary charge pump adjustment system (700) in accordance with an embodiment of the present invention. The charge pump adjustment system (700) includes a charge pump 704), an aging independent reference circuit (712) that generates an aging independent voltage potential or current, e.g., a bandgap voltage potential reference, and a bias circuit (702). The aging independent reference circuit (712) outputs a signal that is substantially constant with respect to aging effects.

In one embodiment of the present invention, the bias circuit (702) uses an output signal from the aging independent reference circuit (712) to determine a variation in transistor performance caused by aging effects. A comparator (720) compares an output signal from the aging independent reference circuit (712) to a feedback signal (721) to determine aging effects.

The feedback signal (721) results from a diode connected n-channel transistor (734) connected to a p-channel transistor (732) controlled by the comparator (720). The comparator (720) attempts to minimize the difference between an output signal from the aging independent reference circuit (712) and the feedback signal (721) by controlling the p-channel transistor (732).

A resistor between the p-channel transistor (732) and n-channel transistor (734) provides isolation between the p-channel transistor (732) and n-channel transistor (734). The resistor may be formed from resistive material and/or a MOS device implemented as a resistor.

The n-channel transistor (734) connected to the p-channel transistor (732) is used to control bias transistors (750, 752, 754, 756) that may limit the current into and out of the charge pump (704).

The charge pump (704) includes a switch circuit (706) and two differential amplifiers (708, 710). The switch circuit (706) operatively adjusts the current output on signal line (740) based on complementary up signals and complementary down signals. In one embodiment of the present invention, the current output on signal line (740) increases or decreases dependent on which of the complementary up signals or the complementary down signals is at a high state for a longer duration. The two differential amplifiers (708, 710) amplify the current output on signal line (740).

One of ordinary skill in the art will understand that the bias circuit (702) and/or the charge pump (704) may be biased by other circuits. For example, bias signals, $V_{BP}$ (409 shown in FIG. 4) and $V_{BN}$ (411 shown in FIG. 4), generated from a bias generator (408 shown in FIG. 4) (discussed above) may be used to provide an additional bias.

One of ordinary skill in the art will understand that the aging independent reference circuit (712) and/or the bias circuit (702) may adjust multiple charge pumps, e.g., charge pump (704).

Figure 8:
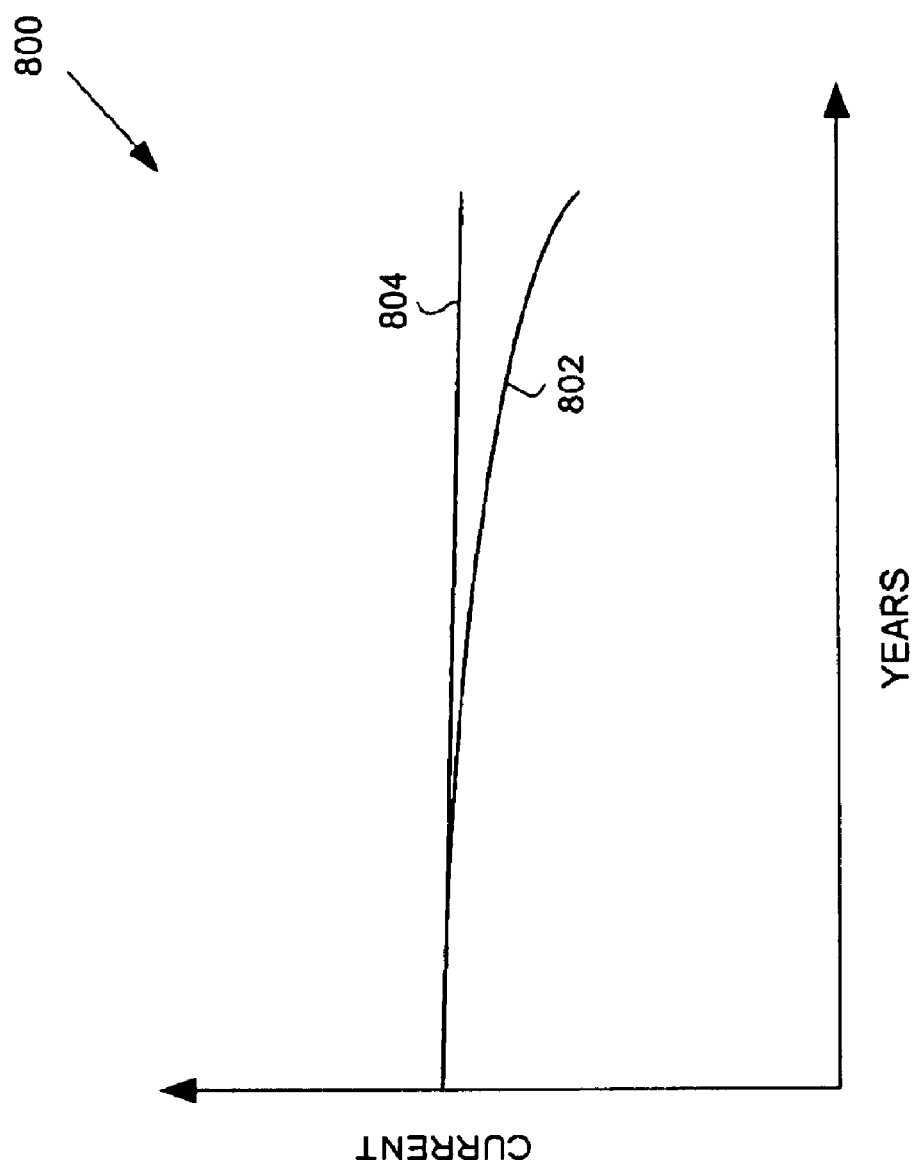
FIG. 8 shows a graph of current through a transistor with and without a charge pump adjustment system in accordance with an embodiment of the present invention.

FIG. 8 shows an exemplary graph (800) of current through a transistor with and without a charge pump adjustment system in accordance with an embodiment of the present invention. For example, current through transistor (750 shown in FIG. 7) or through transistor (756 shown in FIG. 7) may be represented by the graph (800) with and without a charge pump adjustment system, e.g., the charge pump adjustment system shown in FIG. 7.

Graph line (802) shows current through a transistor without a charge pump adjustment system. The current decreases over time due to aging effects. Graph line (804) shows current through a transistor with a charge pump adjustment system. The current remains substantially constant over time because effects due to aging have been compensated by a charge pump adjustment system. For example, an aging independent reference circuit (712 shown in FIG. 7) and/or a bias circuit (702 shown in FIG. 7) may adjust (or bias) a transistor such that aging effects does not affect performance of the transistor. In the case of a PLL, for example, degradation of a transistor's performance, as shown by graph line (802), may modify a PLL's loop bandwidth such that the PLL becomes unstable.

Advantages of the present invention may include one or more of the following. In one or more embodiments, because transistors may age, a reference circuit that responds to aging effects may adjust a charge pump. Accordingly, the charge pump biased by the reference circuit may not skew over a lifetime, or other time period, of an IC.

In one or more embodiments, a reference circuit uses an aging independent reference circuit and a bias circuit. The bias circuit compares an output from the aging independent reference circuit and at least one circuit element that is affected by aging effects. Accordingly, the reference circuit may adjust a charge pump such that an output from the charge pump may not skew over a lifetime, or other time period, of an IC.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
    a charge pump arranged to generate a current dependent on a phase difference between a first signal and a second signal; and
    a reference circuit operatively connected to the charge pump and arranged to adjust the charge pump so that the charge pump operates substantially independent of an aging effect, the aging effect being a physical characteristic of an element that changes over time.

2. The integrated circuit of claim 1, further comprising a phase detector operatively connected to the charge pump and arranged to detect the phase difference between the first signal and the second signal.

3. An integrated circuit, comprising:
    a charge pump arranged to generate a current dependent on a chase difference between a first signal and a second signal; and
    a reference circuit operatively connected to the charge pump and arranged to adjust the charge pump so that the charge pump operates substantially independent of an aging effect,
    wherein the reference circuit comprises an aging independent reference circuit and a bias circuit.

4. The integrated circuit of claim 3, wherein the aging independent reference circuit is operatively connected to the charge pump and arranged to provide a reference that is independent of the aging effect.

5. The integrated circuit of claim 3, wherein the bias circuit comprises a comparator operatively connected to the charge pump and arranged to adjust the charge pump dependent on the aging independent reference circuit and a feedback signal.

6. The integrated circuit of claim 3, wherein the bias circuit comprises at least one bias transistor arranged to adjust the charge pump.

7. The integrated circuit of claim 3, wherein the aging independent reference circuit comprises a bandgap voltage potential reference.

8. The integrated circuit of claim 3, wherein the aging independent reference circuit generates a voltage potential that is independent of the aging effect.

9. The integrated circuit of claim 3, wherein the aging independent reference circuit generates a current that is independent of the aging effect.

10. The integrated circuit of claim 1, further comprising a delay locked loop, wherein the delay locked loop comprises the phase detector and the charge pump.

11. The integrated circuit of claim 1, further comprising a phase locked loop, wherein the phase locked loop comprises the phase detector and the charge pump.

12. A method, comprising:

detecting a phase difference between a first signal and a second signal;

generating a current dependent on the detecting; and adjusting the current dependent on a reference circuit that is responsive to an aging effect, the aging effect being a physical characteristic of an element that changes over time.

13. The method of claim 12, wherein the adjusting comprises:

generating an aging independent reference signal; and comparing the aging independent reference signal and a feedback signal.

14. The method of claim 13, wherein the generating the aging independent reference signal produces an aging independent voltage potential.

15. The method of claim 13, wherein the generating the aging independent reference signal produces an aging independent current.

16. The method of claim 13, wherein the generating the aging independent reference signal uses a bandgap voltage potential reference.

17. The method of claim 12, further comprising:

producing a signal delay with an amount of delay operatively dependent on the detecting.

18. The method of claim 12, further comprising generating an oscillating signal with a frequency operatively dependent on the detecting.

19. An apparatus, comprising:

means for detecting a phase difference between a first signal and a second signal;

means for generating a current dependent on the means for detecting;

means for generating an aging independent reference signal, wherein the means for generating the aging independent reference signal is responsive to an aging effect of the apparatus, the aging effect being a physical characteristic of an element that changes over time; and means for adjusting the current dependent on the means for generating the aging independent reference signal.

20. The apparatus of claim 19, further comprising:

means for comparing the aging independent reference signal and a feedback signal.

* * * * *

UNITED STATES PATENT AND TRADEMARK OFFICE
CERTIFICATE OF CORRECTION

PATENT NO.     : 6,812,755 B2
DATED          : November 2, 2004
INVENTOR(S)    : Gin S. Yee et al.

It is certified that error appears in the above-identified patent and that said Letters Patent is hereby corrected as shown below:

Column 8,
Line 49, please replace "chase" with -- phase --.

Signed and Sealed this

Fifteenth Day of March, 2005

JON W. DUDAS
*Director of the United States Patent and Trademark Office*